United States Patent
Brodsky

(10) Patent No.: US 6,375,475 B1
(45) Date of Patent: Apr. 23, 2002

(54) METHOD AND STRUCTURE FOR CONTROLLED SHOCK AND VIBRATION OF ELECTRICAL INTERCONNECTS

(75) Inventor: William Louis Brodsky, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/800,148

(22) Filed: Mar. 6, 2001

(51) Int. Cl.$^7$ ................................................. H01R 9/09
(52) U.S. Cl. ......................................................... 439/66
(58) Field of Search ............................... 439/66, 65, 69, 439/71, 591, 594, 86, 91, 67, 68, 525, 566

(56) References Cited

U.S. PATENT DOCUMENTS

| | | | |
|---|---|---|---|
| 4,988,306 A | | 1/1991 | Hopfer, III et al. ............ 439/66 |
| 5,122,067 A | | 6/1992 | Sunne .......................... 439/91 |
| 5,287,757 A | * | 2/1994 | Polaert et al. .......... 73/862.627 |
| 5,414,298 A | * | 5/1995 | Grube et al. ................. 257/690 |
| 5,528,462 A | | 6/1996 | Pendse ....................... 361/767 |
| 5,599,193 A | | 2/1997 | Crotzer ........................ 439/66 |
| 5,635,750 A | * | 6/1997 | Schlaak et al. ............. 257/414 |
| 5,650,919 A | | 7/1997 | Loh et al. .................... 361/779 |
| 5,720,630 A | | 2/1998 | Richmond et al. .......... 439/591 |
| 5,809,676 A | * | 9/1998 | Sukumoda et al. ........... 40/452 |
| 5,886,590 A | | 3/1999 | Quan et al. .................... 333/33 |
| 5,899,757 A | | 5/1999 | Neidich et al. ................ 439/67 |
| 5,939,783 A | | 8/1999 | Laine et al. ................. 257/702 |
| 5,940,278 A | | 8/1999 | Schumacher ................ 361/769 |
| 5,969,953 A | | 10/1999 | Purdom et al. ............. 361/790 |
| 6,015,081 A | * | 1/2000 | Okabayashi et al. ... 228/180.22 |
| 6,036,502 A | | 3/2000 | Neidich et al. ................ 439/67 |
| 6,086,386 A | * | 7/2000 | Fjelstad et al. ............... 439/70 |
| 6,174,174 B1 | * | 1/2001 | Suzuki et al. .................. 439/71 |
| 6,178,629 B1 | * | 1/2001 | Rathburn .......................... 29/8 |
| 6,210,173 B1 | * | 4/2001 | Matsunaga .................... 439/66 |

* cited by examiner

*Primary Examiner*—Tho D. Ta
*Assistant Examiner*—Phuong Nguyen
(74) *Attorney, Agent, or Firm*—James A. Lucas; Driggs, Lucas, Brubaker & Hogg Co., LPA

(57) ABSTRACT

An electronic subassembly includes a printed circuit board and an electronic module, particularly a ceramic module, electrically connected to one another through a planar interposer. The interposer includes an insulator sheet and electrical spring elements joining contact sites on the module with contact pads on the PCB. The invention includes modifications that improve the integrity of electrical connections between the printed circuit board and the electronic module. This is achieved by compensating for non-planarity between the surfaces of the interposer and the module, particularly resulting from a convex curvature of the module, by minimizing relative movement, such as rocking in the x-z and y-z planes. It also includes modifications to the suspension of the module within the interposer housing to reduce the effects caused by any sliding that may occur between the interposer and the module in the x-y plane.

6 Claims, 4 Drawing Sheets

METHOD AND STRUCTURE FOR CONTROLLED SHOCK AND VIBRATION OF ELECTRICAL INTERCONNECTS

FIELD OF THE INVENTION

This invention relates to electrical contacts between printed circuit boards and electronic modules, particularly involving contact sites through land grid array (LGA) sockets.

BACKGROUND OF THE INVENTION

A typical LGA interposer system comprises a printed circuit board (PCB) with electrically conductive contact pads, a module (or other printed circuit board) with a corresponding set of electrically conductive contact sites, an interposer between the module and the printed circuit board and an array of spring elements to make electrical contact between the module and the printed circuit board. Clamps are used to mechanically hold the module to the interposer and to electrically join the module contact sites through the spring elements to the printed circuit board pads.

A cooling device or heat sink is typically coupled to the module required to provide cooling of the entire electronic assembly. Many of the heat sinks have a substantial size and mass relative to the other components. This size and mass create a moment arm, causing relative movement between the module and the other components when the assembly is subjected to shock or vibration.

The spring elements used to make the electrical contact between the module sites and the PCB pads may be any one of a number of different types. Among the spring elements are metal filled elastomers, such as those sold by Tyco Inc. (formerly Thomas & Betts) as Metal Particle Interconnect Elastomers. Others are compressible wadded wires, commonly referred to as fuzz buttons shown, for example, in the following patents: U.S. Pat. Nos. 5,552,752; 5.146.453 and 5,631,446. These are small, irregularly wound and intertwined pads or balls and are made of gold plated beryllium copper wool or gold plated molybdenum wire. Metal springs are also used. These metal springs generally are leaf springs having a number of geometries, such as C-shaped or V-shaped.

In typical LGA applications, shock and vibration can cause a variety of problems which may manifest themselves in decreased reliability and life expectancy, resulting in ongoing maintenance and repair problems. These problems can be viewed from two coordinate systems; 1) The in-plane or x-y axis, as seen when looking at an LGA interposer site, and 2) The x-z or y-z planes which are perpendicular to the board surface.

Problems Along the In-plane or x-y Axis

Typically, an interposer structure uses eight leaf springs (two per side positioned toward the corners) to center the module in an interposer housing. Using spring support on all four edges of the module provides very low (i.e. near zero) spring constant for the module during shock and vibration. As the heat sink mass increases, the natural frequency of the response decreases.

Sliding can occur between the surface of the module and the corresponding surface of the interposer. The module is held in position relative to the interposer by at least two springs on each edge of the module. The shear force between the surfaces is equal to the clamping force applied at right angles to the surfaces, multiplied by the coefficient of friction between the two surfaces.

Efforts that have been used to combat this problem include increasing the assembly clamping force. This increases the friction between the module and the interposer and tends to flatten the two components. Consequently, it increases stresses within these components, thereby leading to cracks or failures of the module and reduced product life.

As the response natural frequency of the system decreases, the alignment springs provide less module restraint during excitation. The only remaining support is the frictional contact that may occur between the module and the spring elements and/or interposer housing.

Problems Along the x-z or y-z Plane

The z-axis problem contains some additional attributes of significance. Module substrate flatness is a critical factor for module motion that is perpendicular to the printed circuit board surface. A flatness of 3 to 6 mils for a ceramic module is common in the industry today, but there is no control over whether the surface is 'concave' or 'convex'. For a 'convex' module surface, the center portion of the contact array field is closer to the interposer surface than to the edge portions. There are no established standards or specifications for the flatness of the surface of the interposer, although it is common to strive for a flatness of +/−2 mils.

When a non-flat module substrate is mated to an interposer, this center of the substrate can contact the interposer housing surface first, creating a second loading path (parallel to the spring elements). If there are approximately the same number of spring elements on either side of the contacting portions of the module and interposer, the net stiffness of the elements is again very small. When this assembly is subject to shock and vibration, the heat sink mass and movement arm tend to 'rock' the module in the interposer housing. This 'rocking' creates contact micromotion, leading to contact wear, and electrical resistance problems. Contact motion of a small amplitude or micromotion creates two reliability risks for an electrical contact. First is the risk of disturbing the contact 'a' or asperity spot where electrical contact actually occurs. If the 'a' spot is disturbed, the electrical contact must be re-established before the next pulse of a digital signal can pass through the connection. This time to re-establish would be measured in nano-seconds. Secondly, small amounts of contact motion can wear the plated precious metal layer intended to protect the contact from corrosion. If the plated layer wears through to the base material susceptible to corrosion, the electrical resistance of the contact can increase, thereby inhibiting the electrical signal from passing.

Another drawback is that there is no protocol for the assembly of the module and interposer in a manner that will provide for the two mating surfaces to be matched so that a concave portion of one body will coincide with a convex surface of the other. Thus, whenever there are non-planar contact points, micro movements in the plane or at an angle to the plane of the module and the interposer can occur.

U.S. Pat. No. 5,720,630 relates to electrical connectors that are adapted to function reliably even under conditions of extreme vibration. These serve to overcome the necessity of providing a large contact area between male and female contact sites. This decreases the degree of design flexibility for the connectors, and the weight of the connector assembly. The connectors utilize a compressible, conductive contact enabling electric signals and current to flow between male contact pins.

SUMMARY OF THE INVENTION

The present invention relates to the prevention or reduction of the contact motion during shock and vibration or other mechanical disturbance of an LGA socket, thereby substantially minimizing electrical resistance problems and mechanical failures between a printed circuit board and a module or other PCB.

One objective of the present invention is to increase the natural frequency of the module-to-LGA mounting system under a given load to accommodate more mechanical disturbance of the assembled system. As the natural frequency increases, the displacement decreases, thereby providing less module motion and increased contact life.

Another objective is to alleviate contact micro-motion and to reduce reliability problems, while at the same time supporting larger heat sink masses.

Yet another objective is to reduce rocking motion between a module, such as a ceramic module, and an interposer in situations wherein the contact surface of the module is convex with respect to the surface of the interposer.

For purposes of briefly describing the present invention, the interposer, module and circuit board are deemed to be rectangular in shape, generally flat and relatively thin in proportion to their planar surfaces. It is understood, however, that the teachings of the invention are likewise applicable to these components, even though they may have other designs, shapes, and configurations.

One solution to this motion problem in the x-y plane is to provide fixed restraints around the periphery on at least two edges of the module/interposer system. One arrangement comprises the use of two substantially rigid projections on a first edge of the interposer. At least one, and more typically two, spring members are located on an edge (i.e. edge 3) opposite of the first edge. One or two substantially rigid projections are positioned on a second edge (edge 2) that is adjacent and substantially perpendicular to the first edge to provide a second restraint. At least one, and more typically at least two, spring members are located on the edge (edge 4) opposite of the second edge, thereby creating a force toward the alignment position on the second edge.

Among the benefits of this solution along the x-y plane are:

Alignment spring rate does not essentially cancel during micro-motion;

Better absolute positional tolerance; and

During shock and vibration toward the spring members (i.e. edges 3 and 4), spring preload must be overcome before module motion is a concern.

Rocking motion along the z-axis may be caused by any convex curvature of the surface of the module facing the interposer, or partial compression of contacts leaving a gap between the adjacent surfaces of the module and the interposer insulator. This problem is solved by the use of one or more substantially rigid supports, which are provided on the interposer along the z-axis. These supports serve as stops to prevent rocking of the module relative to the interposer during shock and vibration. The force to maintain contact between the stops and the module is provided by the conventional clamping system. These rigid supports provide a support rim on the perimeter of the module that is higher than the non-flatness of the module. Preferably, the combined height of the stops is at least equal to two times the vertical distance between the perimeter of the convex surface and the top of the convex surface, whereby the stops engage the perimeter of the module without the module contacting the planar portion of the interposer.

Advantages of the z-axis solution:

A common goal for the LGA interposer system is to increase the contact compliance or contact travel under a given amount of loading to accommodate more actuation tolerance. As the contact compliance increases, the spring rate decreases, thereby allowing for greater module motion during actuation and, therefore, during shock and vibration. This z-axis support method alleviates contact micro-motion and reliability problems while supporting larger heat sink masses.

The present invention comprises an electronic assembly including a printed circuit board, an electronic module and an interposer, and a method of controlling the relative motion between the module and the interposer in such an assembly. The printed circuit board includes a plurality of electrical contact pads thereon. The module can be made of ceramic, a dielectric, plastic or other rigid material. It has a bottom surface that includes a plurality of contact sites, some of which correspond to the pads on said printed circuit board. The interposer is positioned between said printed circuit board and said bottom surface of the module and comprises an insulator and a plurality of compressible spring elements, each adapted to electrically connect one of said electrical contact pads of said printed circuit board to a respective one of said contact sites on the surface of said module. The assembly further includes means for controlling relative motion between the interposer and the module. This is achieved by the use of an interposer having two spacedly positioned supports projecting therefrom toward said module such that said module engages said supports. If the module is not planar, but has a convex surface facing the interposer, the supports serve as stop members spaced apart and extending at right angles to the planar surface of the interposer, and along two edges thereof, into contact with the module. These stops serve to limit rocking motion caused by the convex curvature of the module relative to the planar surface of the interposer. The interposer may also include two contiguous edges containing edge restraints positioned to align the contact sites of the module with the contact pads on the PCB. Springs interconnect the other two edges of the interposer to the module. The restraints serve to limit sliding along the planar surfaces of the module and the interposer.

The invention also relates to an interconnection between one or more contact pads on a surface of a printed circuit board and the corresponding contact sites on a surface of an electrical module. The interposer is positioned between the printed circuit board and the module and includes a compressible, electrically conductive contact for each pad and site. The interposer further includes a plurality of stop members and/or restraints projecting therefrom to limit the motion between the module, the interposer and the printed circuit board caused by the clamping force applied during the assembly process. If the bottom surface of the module is convex, the interposer includes two spacedly positioned stop members projecting therefrom toward said module such that the edges of the module engage only said stop members and the spring elements. The two stop members extend at right angles to the planar surface of the interposer and limit the rocking movement of the module that may occur due to shock and vibration. Means for controlling the relative sliding motion between the module and the interposer comprise two contiguous edges of the interposer containing edge restraints positioned to align the contact sites of the module with the contact pads of the PCB. This also serves to reduce the available surface area of the interposer against which the module can slide. The springs interconnect the other two edges of the interposer to the module.

The invention also relates to a sub-assembly and its method of assembly comprising a rigid electronic module having a generally planar surface and an interposer having a generally planar surface against which the module is clamped. The module can be ceramic, a dielectric, plastic or other rigid material. Means are provided to limit the relative movement of the module with respect to the interposer when the sub-assembly is subject to shock and/or vibration. The limiting means serves to limit relative sliding movement along the x and y axis parallel to the planar surfaces, and comprises restraints along two contiguous sides of the interposer. The limiting means can also limit the relative movement along the z-axis orthogonal to the planar surfaces and comprise at least two stops that restrict the rocking movement of the module with respect to the interposer caused by a lack of planarity of the bottom surface of the module.

DETAILED DESCRIPTION OF THE INVENTION

Figure 1:
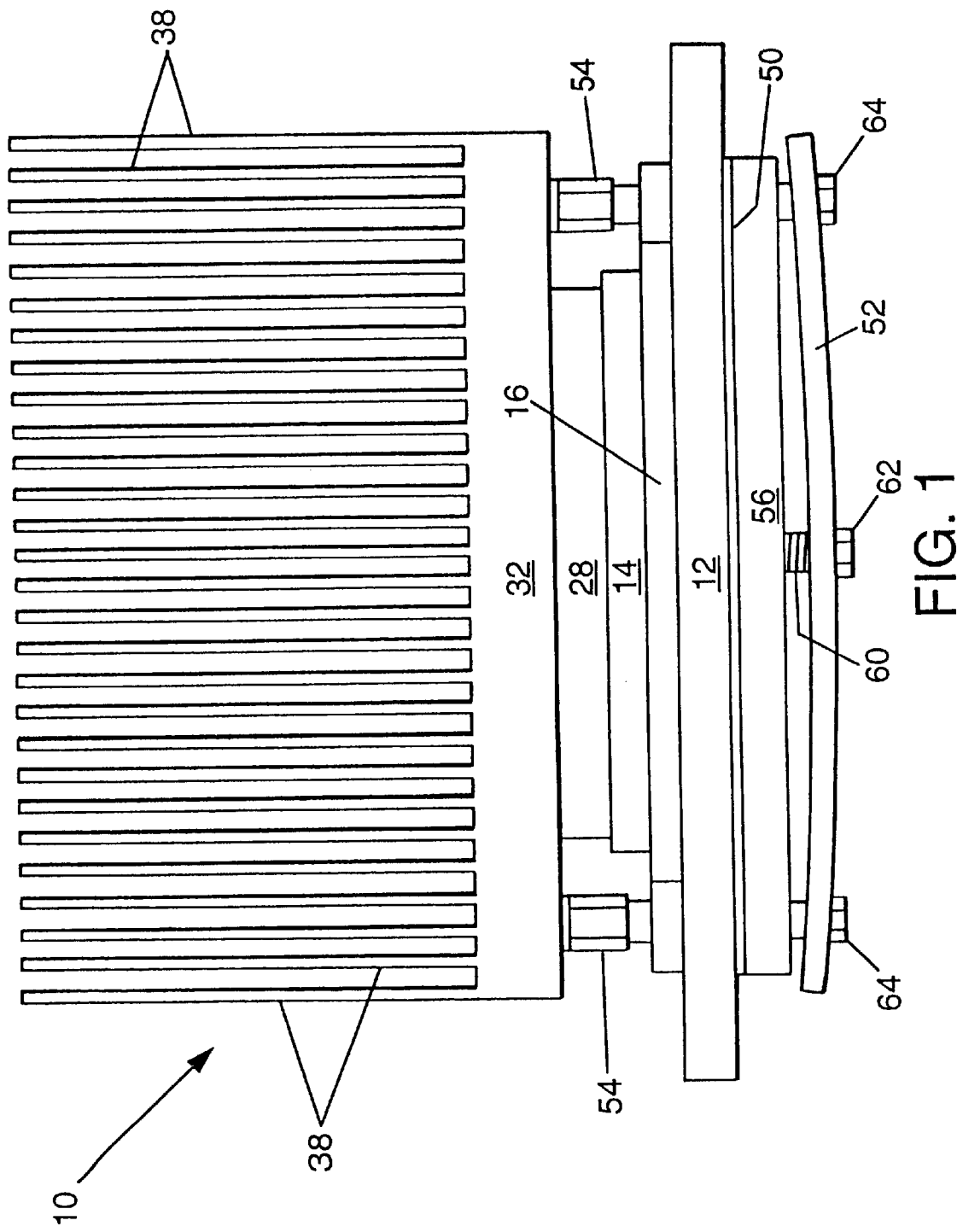
FIG. 1 is an elevational view of a printed circuit board assembly.

Referring now to the drawings, and particularly to FIG. 1, an electronic circuit board assembly 10 is shown. The electronic assembly 10 comprises a printed circuit board 12 of standard construction typically composed of multiple circuitized conductive layers interleaved with layers of high dielectric material (these various layers not being shown) in the form of a laminate. One side of the board is backed with an insulator 50 and a stiffener 56. A spring plate 52 is mounted on posts 54 and includes a screw 60 that urges the stiffener against the insulator and the PCB 12, thereby serving to maintain the planarity of the PCB. The screw typically includes an Allen head 62 which is turned with an Allen-head wrench. Turning the screw 60 in one direction increases the spacing between the middle of the spring plate and the stiffener, thereby increasing the pressure exerted by the spring plate on the stiffener at the posts 54. Turning the screw 60 the other way decreases this spacing and, thus, the applied pressure. Mushroom slots (not shown) along the sides of the spring plate allow the spring plate to engage the posts 54 and to be held in place by end caps 64.

On the opposite side of the PCB 12 is an electrical module 14. An interposer 16 separates the module 14 from the PCB 12. A heat conductive cap 28 is placed on top of the module and interfaces with a heat sink 32. The heat sink typically includes heat transfer fins 38 to dissipate heat generated during the operation of the assembly. The entire assembly is clamped together by posts 54 that extend through holes passing through the various components and secured in place by nuts (not shown).

Figure 2:
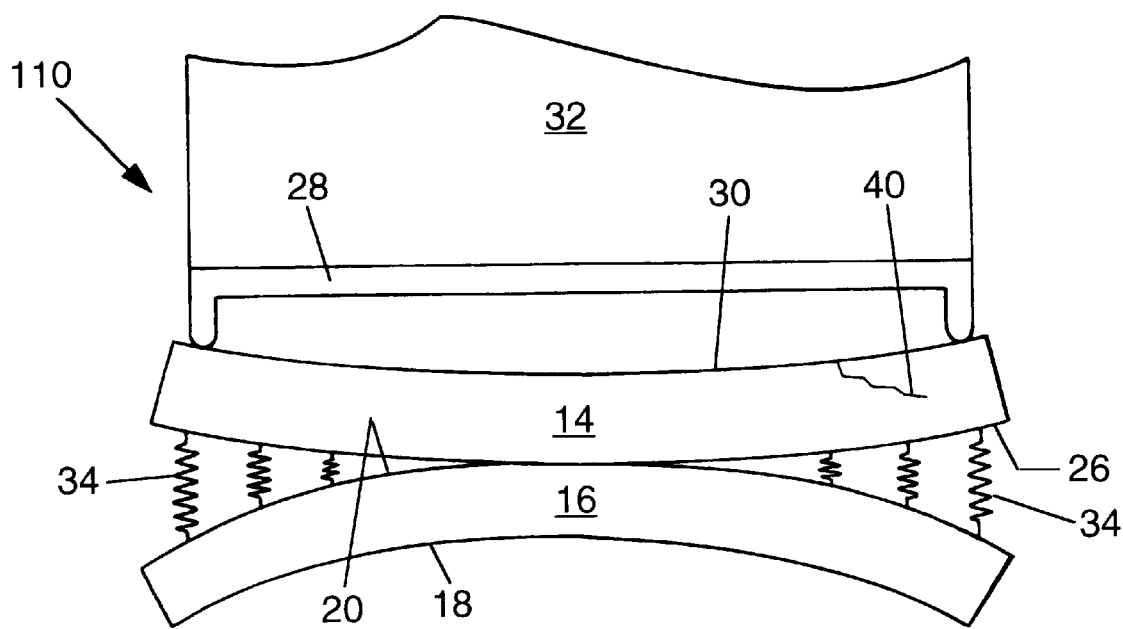
FIG. 2 is a cross-sectional view of a module of the prior art.

FIG. 2 shows a sub-assembly 110 comprising an electronic module 14 and an interposer 16. The module 14 is made from a ceramic material. The interposer 16 is comprised of two elements, an insulator and the electrical spring elements (herein shown as contact springs 34). The interposer is generally planar and is made from plastic or similar material, such as a polyphenylsulfide resin having good mechanical strength and dimensional stability. It serves to electrically and mechanically isolate the module 14 from the PCB (not shown) and to position the springs 34. The interposer 16 includes a first planar surface 18 in contact with a corresponding surface (not shown) of the PCB, and a second surface 20 facing a first surface 26 of the module. A cap 28 covers the second surface 30 of the module. A heat sink 32 is shown in contact with the cap 28. A plurality of contact springs 34 serve to keep the module accurately positioned with respect to the board. These springs also provide electrical continuity between contact sites on the module and corresponding contact pads on the circuitized surface of the PCB. The clamp provides a compressive clamping force to the subassembly in the manner shown in FIG. 1.

When the module and the interposer are clamped together, the clamping force $F_c$ is distributed over the entire contact surfaces if they are fully coplanar. When the surfaces are not coplanar, as shown in FIG. 2, the force within the area of contact between the ceramic module and the interposer is increased substantially, possibly causing one or more cracks 40 to form on the second surface 30 of the module in compression. These cracks could eventually lead to failure of the module 14 and the entire assembly 10.

Figure 3:
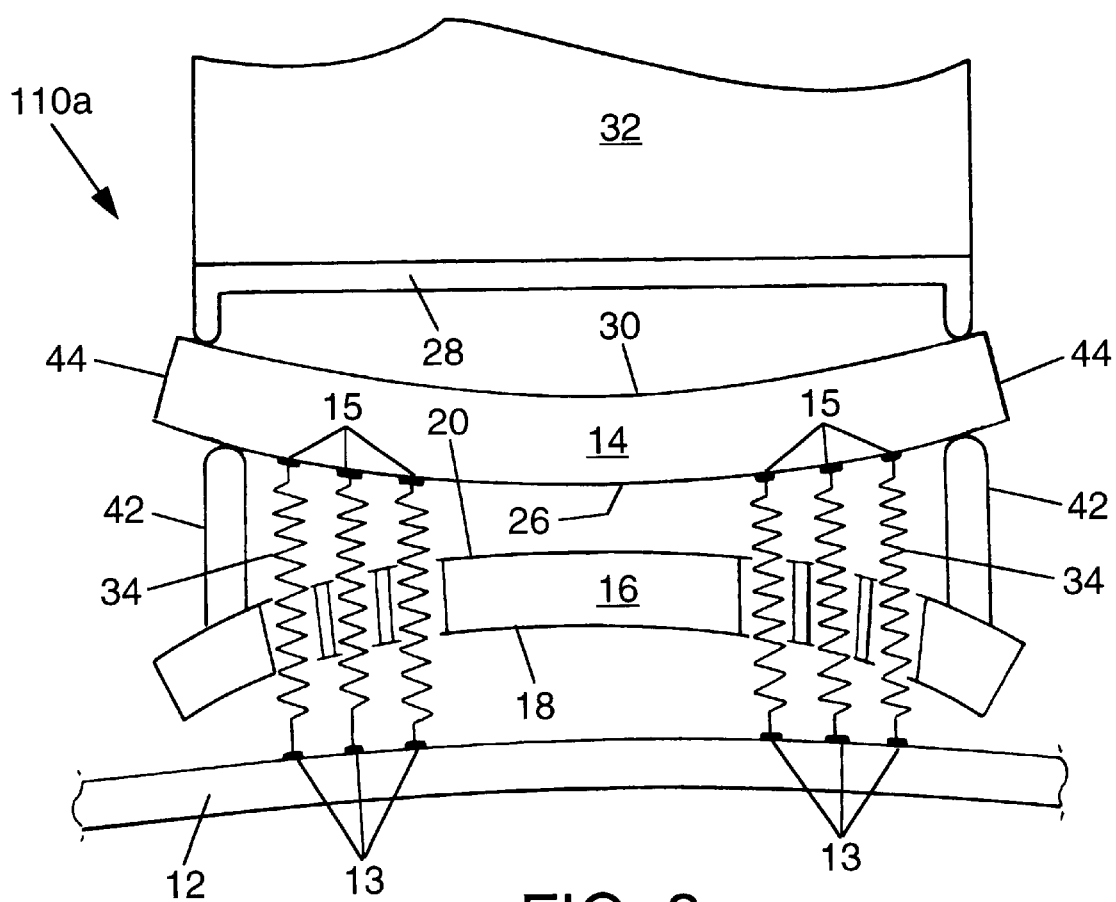
FIG. 3 is a view in cross-section of the module showing partial details of the present invention for limiting motion in the x-z and y-z directions.

Turning now to FIG. 3, there is shown the sub-assembly 110a comprising a printed circuit board 12, a ceramic module 14 and an interposer 16. The interposer includes a first planar surface 18 adapted to contact a corresponding surface of the PCB 12 and a second surface 20 facing the convex surface 26 of the module. A cap 28 covers the second surface 30 of the module and is sealed thereto with a sealant 72, such as Sylgard. The heat sink 32 is shown in contact with the cap 28. As before, contact springs 34 provide electrical continuity between contact sites 15 on the module and corresponding contact pads 13 on the circuitized surface of the PCB. A pair of stop members 42 are positioned at the edges of the interposer and contact the periphery 44 of the module. These serve to limit the rotation or rocking movement between the module and the interposer caused by the mass of the heat sink 32 when the sub-assembly is subjected to shock and/or vibration..

The addition of the two stop members 42 serves to limit the rocking motion between the convex contact surfaces of the module and the interposer, provided the clamping force is sufficient to keep one or both of the stop members in contact with the convex surface of the module. The combined height of the stop members should correspond to the curvature of the convex surface, whereby the stop members engage the perimeter of the module without the module contacting the interposer with any more than a minimum amount of pressure when the total clamping force equals the nominal contact normal force times the number of contact springs 34.

Figure 4:
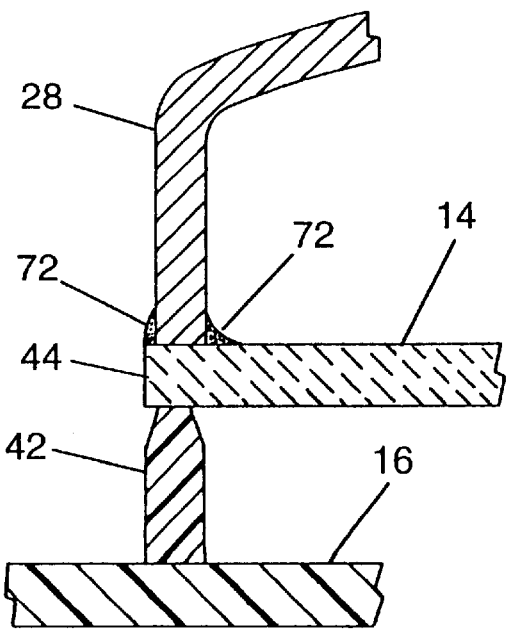
FIG. 4 is an enlarged sectional view taken along lines 4–4' of FIG. 3.

FIG. 4 is an enlargement showing the metal cap 28 joined to the ceramic module substrate 14 with an adhesive sealant 72, such as Sylgard®. An edge stop 42 extends at right angles to the interposer 16 and contacts the edge 44 of the module 14. Preferably, the stop 42 is positionally aligned with the cap 28 on opposite sides of the module to minimize bending stress in the module. The edge stop 42 co-acts with a corresponding edge stop (not shown) on the opposite side of the interposer to restrict any rocking motion between the module 14 and the interposer 16 caused by shock or vibration to the assembly. It should also be understood that the edge stop may consist of a one-piece ring extending around all edges of the module.

Figure 5:
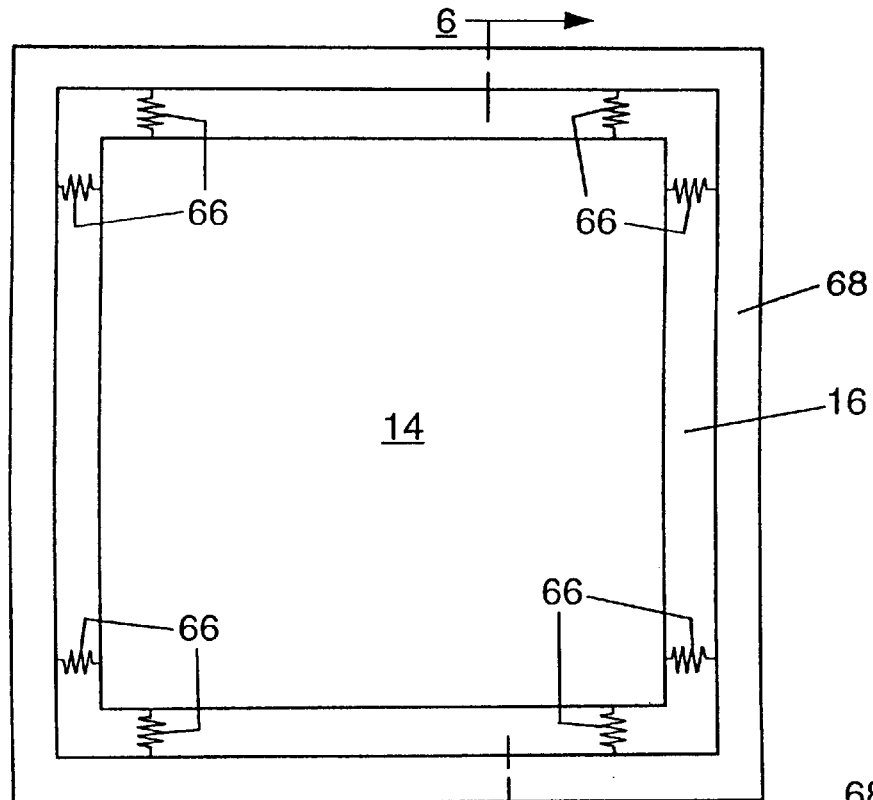
FIG. 5 is a planar view of the prior art showing a module suspended from an interposer housing.
Figure 6:
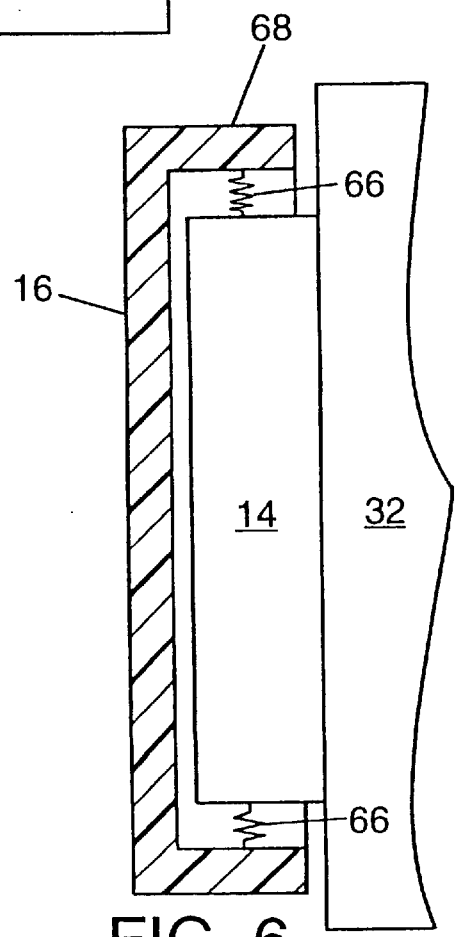
FIG. 6 is a cross-sectional view taken along lines 6–6' of FIG. 5.

FIGS. 5 and 6 show a module 14 joined to an interposer 16 by a plurality of suspension springs 66. Heat is transferred from the module 14 to the heat sink 32. The interposer 16 is shown as being generally planar with raised edges 68 forming a housing in which the module is suspended. Two springs connect each edge of the module to a corresponding edge 68 of the interposer housing. The force required to cause the module to slide in a given direction against the planar surface of the interposer is equal to the summation of forces of the springs acting perpendicular to the direction of motion, plus any clamping force applied perpendicular to the plane shown multiplied by the coefficient of friction between the two surfaces. Added to this is the spring force of any spring elements (not shown here) acting perpendicular to the direction of motion multiplied by the coefficient of friction for each spring element.

Figure 7:
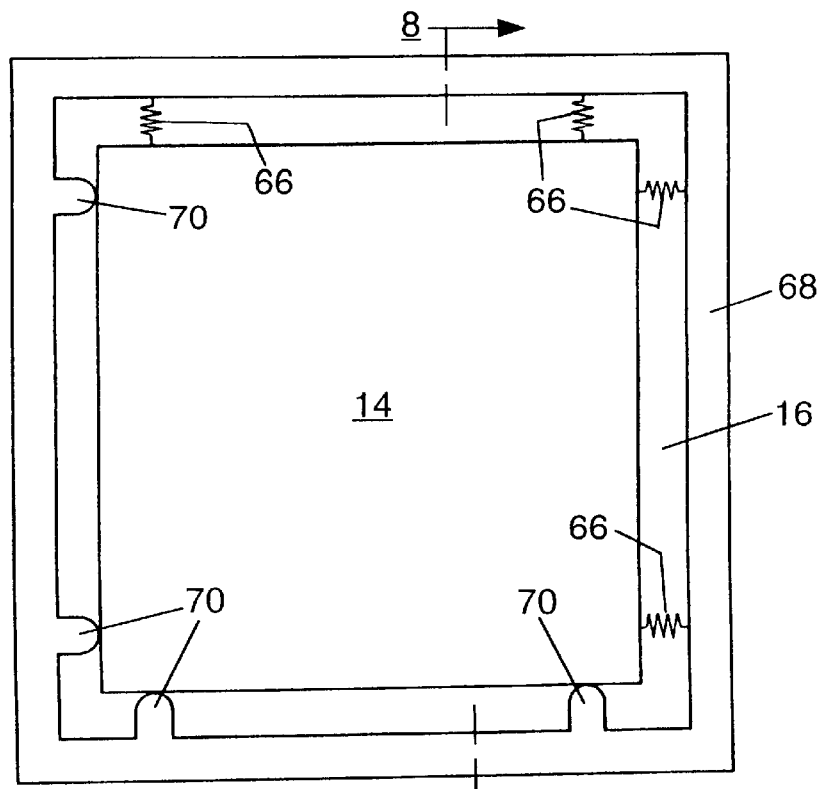
FIG. 7 is a planar view of a module of the present invention suspended from an interposer housing.
Figure 8:
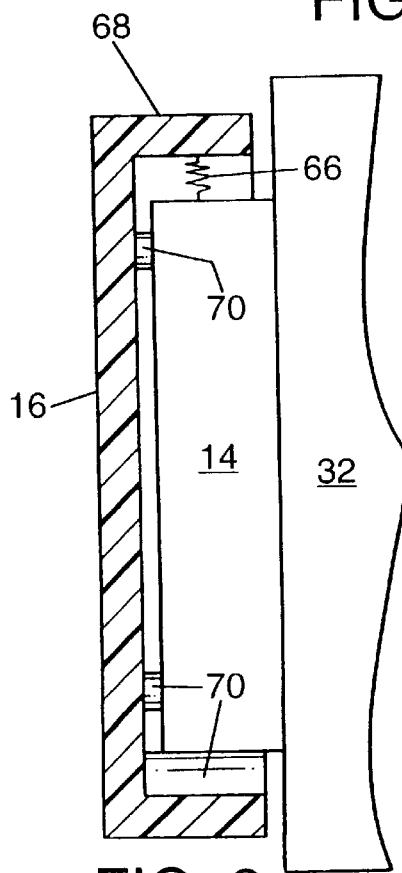
FIG. 8 is a cross-sectional view taken along lines 8–8' of FIG. 7.

FIGS. 7 and 8 show the configuration of FIGS. 5 and 6 wherein the springs 66 on two sides of the interposer housing 68 are replaced by edge restraints 70. According to the teachings of the present invention, these edge restraints are positioned so that the conductive sites on the module are aligned, whereby the pads are centered with respect to the contact spring elements (not shown) and the pads on the printed circuit board (not shown). By using these restraints 70 on two contiguous edges of the housing 68, the summation of forces in the x-plane are equal to zero.

Among the benefits that accompany the use of these restraints are 1) the alignment springs do not cancel each other out; 2) better absolute positional tolerance is achieved, and 3) during vertical shock, the remaining alignment springs still contribute toward assisting module motion.

Figure 9:
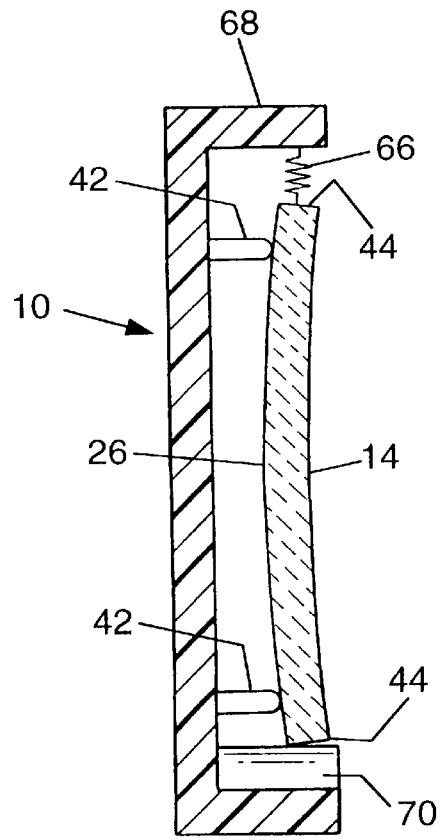
FIG. 9 is a cross-section similar to that shown in FIG. 8.

The invention contemplates the use of the stop members for z-axis motion, and the restraints for motion control in the x-y plane, either together or separately. For example, turning to FIG. 9, a sub-assembly 10 is shown wherein a module 14 is suspended within a interposer housing 68 by springs 66 along two contiguous sides and edge restraints 70 along the other two sides. The module 14 is shown with the surface 26 having a convex curvature. Stop members 42 extend at right angles to the planar surface of the interposer 16 into contact with the periphery 44 of the module 14 to prevent rocking motion. Thus, the combined effect of the restraints 70 and the stop members 42 serve to minimize the micro-motion that can occur when the assembly is subjected to shock and/or vibration.

The specific details and operation of the assembly are known to persons of ordinary skill in the art and do not comprise a part of the present invention, except to the extent that these details and operation have been modified to become part of the present invention, and to interengage with other components of the system. The specific details, including the programming of the individual computers or processors in which the present invention is used, are not deemed to comprise a part of the present invention.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. An electronic assembly comprising:

a printed circuit board having a surface with a plurality of electrical contact pads thereon;

an electronic module including a top surface, a bottom surface, and edge surfaces joining the top and bottom surfaces, said bottom surface having a plurality of contact sites corresponding in location and number to at least some of the contact pads on said printed circuit board;

an interposer positioned between said printed circuit board and said module, said interposer comprising a pair of surfaces, a plurality of compressible spring elements, each spring element adapted to electrically couple one of said electrical contact pads on said printed circuit board to a respective one of said contact sites on the bottom surface of said module;

the interposer including restraints extending toward two edge surfaces of the module and springs suspending the module between two other edge surfaces and the interposer, the restraints serving to control relative sliding motion between the interposer and the module and to align the contact sites on the module with the contact pads on the printed circuit board; and spacedly positioned stop members projecting from said interposer toward said module such that said module engages said stop members, thereby limiting the relative rocking motion between said module and said interposer.

2. The assembly according to claim 1 wherein the module is a ceramic module.

3. The assembly according to claim 1 wherein the module has four edges, the restraints contact two contiguous edges of the module, and the springs interconnect the other two contiguous edges of the module with the interposer.

4. The assembly according to claim 3 wherein the interposer includes a housing that surrounds and is spaced from the edges of the module, and the springs join the housing to the edges of the module.

5. An interconnection between one or more contact pads on a surface of a printed circuit board and the corresponding contact sites on a surface of an electronic module, the interconnection comprising an interposer positioned between the printed circuit board and the module and including compressible, electrically conductive spring elements for each of the contact sites and corresponding contact pads, the interposer having a planar surface and four sides including raised edges extending at right angles to the planar surface of the interposer, said raised edges surrounding the edges of the module and forming a housing therefor, springs suspending the module between first and second contiguous edges of the housing, the interposer further including a plurality of members projecting from a surface thereof toward the module to limit the amount of sliding motion that can occur between the module and the interposer, the members comprising restraints located on the third and fourth contiguous edges of the housing and positioned to align the contact sites of the module with the contact pads of the printed circuit board.

6. An interconnection according to claim 5 further including a plurality of stop members projecting from the planar surface toward the module, the stop members extending at right angles to the planar surface of the interposer into spaced-apart contact with the module to limit the amount of rocking motion that can occur between the module and the interposer.

* * * * *